United States Patent
Arisawa et al.

(10) Patent No.: US 8,443,311 B2
(45) Date of Patent: May 14, 2013

(54) FLARE VALUE CALCULATION METHOD, FLARE CORRECTION METHOD, AND COMPUTER PROGRAM PRODUCT

(75) Inventors: Yukiyasu Arisawa, Ibaraki (JP); Taiga Uno, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/238,616

(22) Filed: Sep. 21, 2011

(65) Prior Publication Data
US 2012/0198395 A1  Aug. 2, 2012

(30) Foreign Application Priority Data
Jan. 28, 2011 (JP) ................... 2011-016414

(51) Int. Cl.
*G06F 17/50* (2006.01)

(52) U.S. Cl.
USPC .............................. 716/54; 716/55

(58) Field of Classification Search ............. 716/54, 716/55
See application file for complete search history.

(56) References Cited

U.S. PATENT DOCUMENTS

| | | | |
|---|---|---|---|
| 6,625,802 B2 | 9/2003 | Singh et al. | |
| 6,898,781 B2 | 5/2005 | Singh et al. | |
| 2010/0175043 A1* | 7/2010 | Mukherjee et al. | 716/21 |
| 2012/0066652 A1* | 3/2012 | Clifford | 716/55 |

FOREIGN PATENT DOCUMENTS

| | | |
|---|---|---|
| JP | 2002-296754 | 10/2002 |
| JP | 2006-178458 | 7/2006 |
| JP | 2007-524255 | 8/2007 |
| JP | 2008-071928 | 3/2008 |
| JP | 2008-276184 | 11/2008 |
| WO | WO 2005/082063 A2 | 9/2005 |

* cited by examiner

*Primary Examiner* — Suresh Memula
(74) *Attorney, Agent, or Firm* — Finnegan, Henderson, Farabow, Garrett & Dunner, L.L.P.

(57) ABSTRACT

In a flare value calculation method according to an embodiment, an average optical intensity is calculated for each of mask patterns in a case where an exposure process is performed on a substrate using the mask patterns. Then, pattern correction amounts for the mask patterns corresponding to the average optical intensity and information about the dimensions of the mask patterns are calculated for each mask pattern. Then, post-correction mask patterns are prepared by performing pattern correction on each of the mask patterns using the pattern correction amount. Then, a flare value of an optical system of an exposure apparatus is calculated using a pattern average density of the post-correction mask patterns.

19 Claims, 8 Drawing Sheets

| | Line [nm] | | | | | | | | |
|---|---|---|---|---|---|---|---|---|---|
| | 16 | 20 | 22 | 24 | 32 | 45 | 90 | 150 | 250 |
| 16 | 0.16 | 0.13 | 0.12 | 0.12 | 0.10 | 0.08 | 0.06 | 0.05 | 0.04 |
| 20 | 0.21 | 0.18 | 0.17 | 0.16 | 0.14 | 0.11 | 0.08 | 0.06 | 0.05 |
| 22 | 0.23 | 0.20 | 0.19 | 0.18 | 0.16 | 0.13 | 0.09 | 0.07 | 0.06 |
| 24 | 0.26 | 0.22 | 0.21 | 0.20 | 0.18 | 0.15 | 0.10 | 0.08 | 0.06 |
| 32 | 0.34 | 0.30 | 0.29 | 0.28 | 0.24 | 0.20 | 0.14 | 0.11 | 0.08 |
| 45 | 0.42 | 0.38 | 0.37 | 0.36 | 0.32 | 0.28 | 0.20 | 0.15 | 0.11 |
| 90 | 0.55 | 0.52 | 0.51 | 0.50 | 0.47 | 0.43 | 0.33 | 0.26 | 0.19 |
| 150 | 0.61 | 0.59 | 0.59 | 0.57 | 0.56 | 0.52 | 0.43 | 0.35 | 0.27 |
| 250 | 0.65 | 0.64 | 0.64 | 0.63 | 0.62 | 0.59 | 0.51 | 0.44 | 0.36 |

(Space [nm] labels the rows; 21 labels the table)

Line [nm]

| | 16 | 20 | 22 | 24 | 32 | 45 | 90 | 150 | 250 |
|---|---|---|---|---|---|---|---|---|---|
| 16 | -5.38 | -5.56 | -5.56 | -5.54 | -5.41 | -5.27 | -4.49 | -3.38 | -1.66 |
| 20 | -6.18 | -6.35 | -6.40 | -6.36 | -6.26 | -6.13 | -5.31 | -4.27 | -2.52 |
| 22 | -6.45 | -6.69 | -6.70 | -6.74 | -6.62 | -6.45 | -5.66 | -4.61 | -2.80 |
| 24 | -6.73 | -6.96 | -7.02 | -6.98 | -6.89 | -6.80 | -5.95 | -4.90 | -3.08 |
| 32 | -7.82 | -8.04 | -8.11 | -8.11 | -8.04 | -7.91 | -7.07 | -5.88 | -4.14 |
| 45 | -9.64 | -9.88 | -9.93 | -10.0 | -9.89 | -9.75 | -8.82 | -7.65 | -5.85 |
| 90 | -15.7 | -15.9 | -16.0 | -16.2 | -15.9 | -15.9 | -14.7 | -13.2 | -11.7 |
| 150 | -23.8 | -24.1 | -24.1 | -24.5 | -23.9 | -24.1 | -22.5 | -21.5 | -19.9 |
| 250 | -37.4 | -37.7 | -37.7 | -38.3 | -37.5 | -37.2 | -36.7 | -35.5 | -33.8 |

Space [nm] (row axis), 21

FLARE VALUE CALCULATION METHOD, FLARE CORRECTION METHOD, AND COMPUTER PROGRAM PRODUCT

CROSS-REFERENCE TO RELATED APPLICATIONS

This application is based upon and claims the benefit of priority from the prior Japanese Patent Application No. 2011-016414, filed on Jan. 28, 2011; the entire contents of which are incorporated herein by reference.

FIELD

Embodiments described herein related generally to a flare value calculation method, a flare correction method, and a computer program product.

BACKGROUND

Recently, with the rapid miniaturization of semiconductor integrated circuits, requirements for CD control of transcription patterns are becoming increasingly strict. Causes of CD variation of transcription patterns may be categorized roughly as mask-derived, exposure apparatus-derived, and resist-derived. For example, when shortening of exposure wavelengths is pursued for further miniaturization of semiconductor integrated circuits, the rate of CD variation derived from the flare of a projection optical system (exposure light diffusely reflected by a projection optical system) becomes relatively larger. This is because the flare is in almost inverse proportion to the square of the wavelength.

For example, the wavelength used in extreme ultra violet lithography (EUVL) emerging as lithography technology of next generation is smaller than the wavelength used in ArF lithography by at least one digit. Therefore, EUVL generates a flare which is larger than that in ArF lithography by about two digits. Previously, extensive time was taken for accurate flare calculation. Furthermore, due to inaccurate flare calculation, unexpected patterns were formed on substrates in some cases despite flare correction. Therefore, fast calculation of accurate flare values has been sought.

DETAILED DESCRIPTION

One embodiment provides a flare value calculation method. In the flare calculation method, an average optical intensity is calculated for each mask pattern by performing an exposure process on a substrate using a mask pattern group where mask patterns of different dimensions are disposed. Also, a pattern correction amount for the mask pattern corresponding to the average optical intensity and information about the mask pattern dimensions is calculated for each of the mask patterns. Pattern correction for the mask patterns using the pattern correction amount for each mask pattern is performed for each pattern to prepare a post-correction mask pattern. A flare value of a projection optical system of an exposure apparatus is calculated using a pattern average density of the post-correction mask pattern.

Exemplary embodiments of a flare value calculation method, a flare correction method, and a computer program product will be explained below in detail with reference to the accompanying drawings. The present invention is not limited to the following embodiments.

EMBODIMENTS

Figure 1:
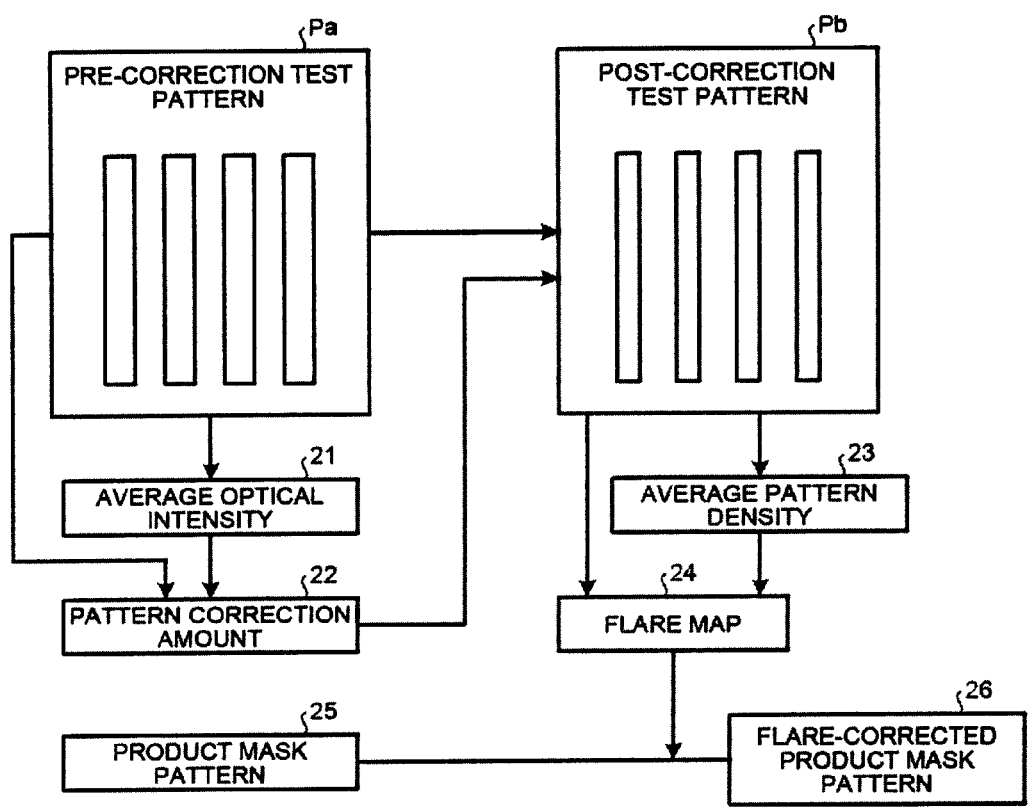
FIG. 1 is a view illustrating a concept of flare correction according to an embodiment.

FIG. 1 is a view illustrating a concept of flare correction according to an embodiment. In the current embodiment, flare correction is performed through pattern correction of a mask pattern of a product mask used during formation of a transcription pattern on a wafer (photosensitized substrate). Flare correction is a method by which pattern deformation arising from sparseness and denseness around a pattern during production of a semiconductor integrated circuit is alleviated by pattern correction.

To calculate a flare value used for flare correction, a pre-correction test pattern Pa is prepared in advance, which is a mask pattern of a test-purpose mask. The pre-correction test pattern Pa is a mask pattern group including line and space (L/S) patterns of different dimensions.

Based on the pre-correction test pattern Pa, the average optical intensity 21 of a space image for each of the L/S patterns is calculated. The average optical intensity 21 is an average value of optical image intensity in a case in which an exposure process is performed on the wafer using each of the L/S patterns.

Then, based on the average optical intensity 21 and the pre-correction test pattern Pa, a pattern correction amount 22 is calculated for pattern correction (resizing) of the pre-correction test pattern Pa. The pattern correction amount 22 is calculated for each type (each dimension) of the L/S patterns. Then, the pattern correction amount 22 is used for correction of the pre-correction test pattern Pa, by which a post-correction test pattern Pb is prepared.

After the post-correction test pattern Pb is prepared, an average pattern density 23 of the post-correction test pattern Pb is calculated. Based on the calculated average pattern density 23 and the post correction test pattern Pb, a flare map 24 (a map in a shot of a flare value) is calculated.

Then, a product mask pattern 25 undergoes pattern correction with the flare map 24 applied to the product mask pattern 25. Thereby prepared is a product mask pattern 26, which is flare-corrected.

As described above, in the current embodiment, pattern correction is performed on the pre-correction test pattern Pa based on the average optical intensity 21 and the flare map 24 is calculated based on the post-correction test pattern Pb. In other words, by considering the average optical intensity of a mask pattern in a simplified manner, more accurate flare calculation is pursued.

Figure 2:
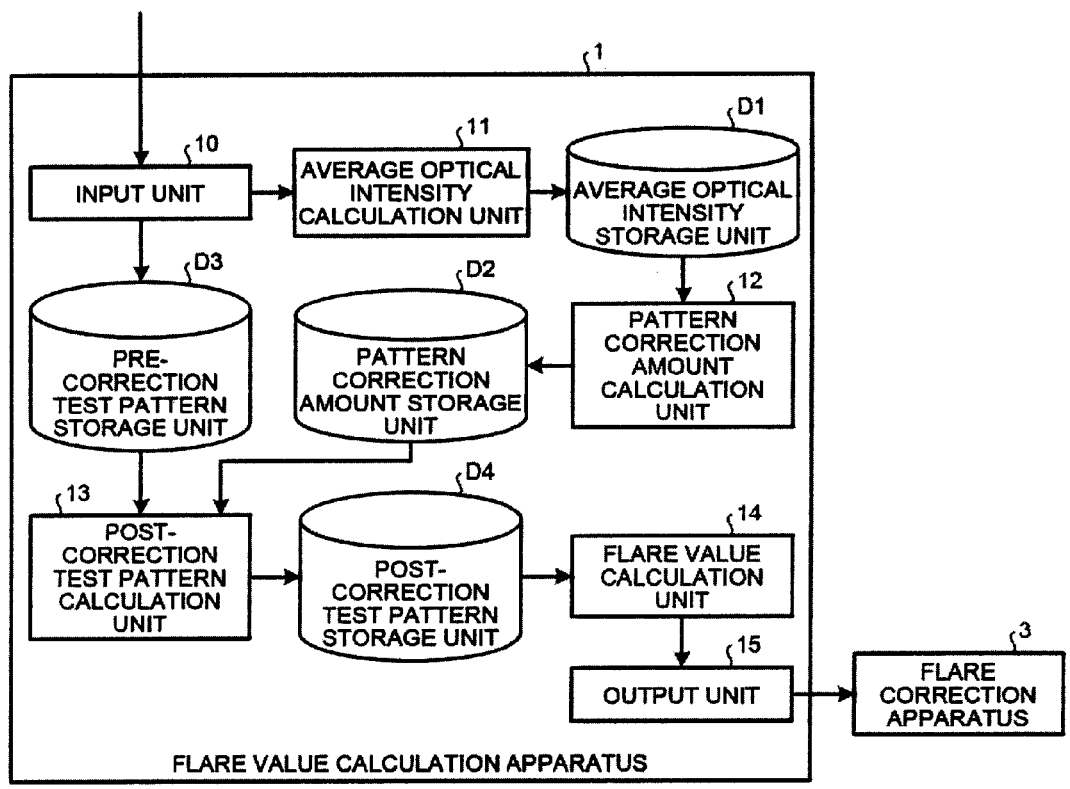
FIG. 2 is a block diagram illustrating a configuration of a flare value calculation apparatus.

FIG. 2 is a block diagram illustrating a configuration of a flare value calculation apparatus. A flare value calculation apparatus 1 is a apparatus such as a computer that calculates a flare value based on the average optical intensity of the mask pattern.

The flare value calculation apparatus 1 includes an input unit 10, an average optical intensity calculation unit 11, a pattern correction amount calculation unit 12, a post-correction test pattern calculation unit 13, a flare value calculation unit 14, and an output unit 15. Also, the flare value calculation apparatus 1 includes an average optical intensity storage unit D1, a pattern correction amount storage unit D2, a pre-correction test pattern storage unit D3, and a post-correction test pattern storage unit D4.

The input unit 10 enters and transmits the pre-correction test pattern Pa and the like to the pre-correction test pattern storage unit D3. The average optical intensity calculation unit 11 calculates the average optical intensity 21 for each L/S pattern based on the pre-correction test pattern Pa in the pre-correction test pattern storage unit D3. The average optical intensity calculation unit 11 transmits the calculated average optical intensity 21 to the average optical intensity storage unit D1.

The pattern correction amount calculation unit 12 calculates the pattern correction amount 22 for each L/S pattern based on the average optical intensity 21 in the average optical intensity storage unit D1. The pattern correction amount calculation unit 12 transmits the calculated pattern correction amount 22 to the pattern correction amount storage unit D2.

The post-correction test pattern calculation unit 13 calculates the post-correction test pattern Pb based on the pre-correction test pattern Pa in the pre-correction test pattern storage unit D3 and the pattern correction amount 22 in the pattern correction amount storage unit D2. In detail, the post-correction test pattern calculation unit 13 prepares the post-correction test pattern Pb by performing pattern correction on the pre-correction test pattern Pa with the pattern correction amount 22. The post-correction test pattern calculation unit 13 transmits the calculated post-correction test pattern Pb to the post-correction test pattern storage unit D4.

The flare value calculation unit 14 calculates the flare map 24 using the post-correction test pattern Pb in the post-correction test pattern storage unit D4. The flare value calculation unit 14 transmits the calculated flare map 24 to the output unit 15. The output unit 15 transmits the flare map 24 to an external apparatus such as a flare correction apparatus 3.

Each of the average optical intensity storage unit D1, the pattern correction amount storage unit D2, the pre-correction test pattern storage unit D3, and the post-correction test pattern storage unit D4 is a memory for storing information used to calculate the flare map 24.

The average optical intensity storage unit D1 stores the average optical intensity 21, and the pattern correction amount storage unit D2 stores the pattern correction amount 22. The pre-correction test pattern storage unit D3 stores the pre-correction test pattern Pa, and the post-correction test pattern storage unit D4 stores the post-correction test pattern Pb. The flare correction apparatus 3 is a apparatus such as a computer performing pattern correction (flare correction) on a product mask pattern using the flare map 24 calculated by the flare value calculation apparatus 1.

Figure 3:
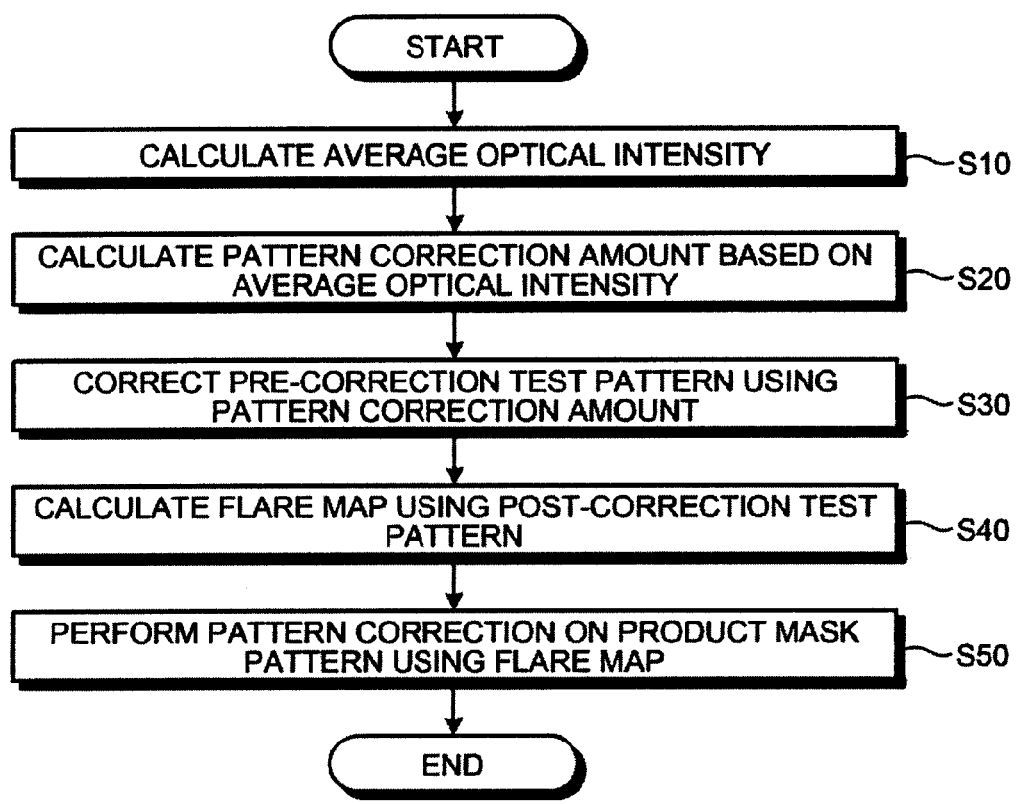
FIG. 3 is a flow chart illustrating a processing order of flare value calculation.

Next, a processing order of flare value calculation is described. FIG. 3 is a flow chart illustrating a processing order of flare value calculation. The pre-correction test pattern Pa is entered into the input unit 10 of the flare value calculation apparatus 1. The input unit 10 transmits the pre-correction test pattern Pa to the pre-correction test pattern storage unit D3. The pre-correction test pattern storage unit D3 stores the pre-correction test pattern Pa.

The average optical intensity calculation unit 11 calculates the average optical intensity 21 for each L/S pattern based on the pre-correction test pattern Pa in the pre-correction test pattern storage unit D3 (step S10). Here, an example of a configuration of the pre-correction test pattern Pa is described.

Figure 4:
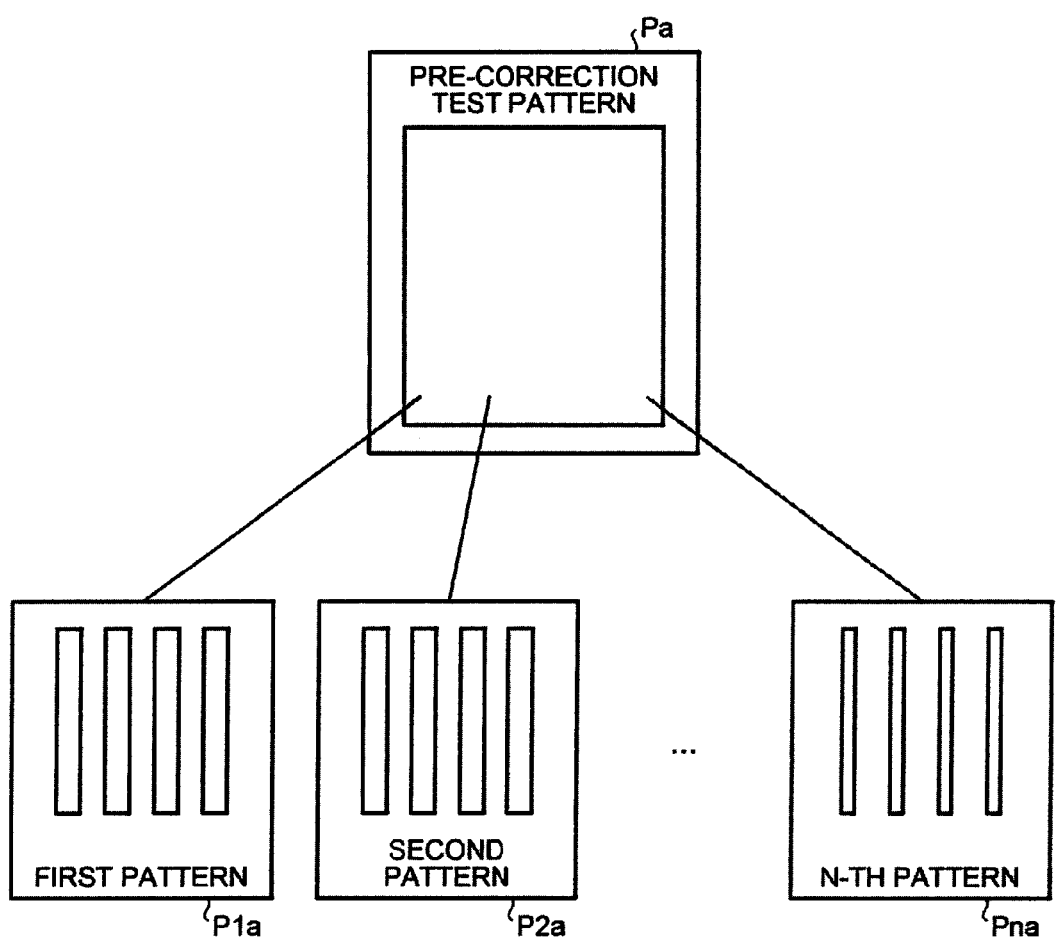
FIG. 4 is a diagram illustrating one example of a configuration of a pre-correction test pattern.

FIG. 4 is a view of one example of a configuration of a pre-correction test pattern. The pre-correction test pattern Pa stores L/S patterns in an area, for example, 50 mm in length and 50 mm in width, the L/S patterns measuring 50 mm alike in a longitudinal direction and having different dimensions in a cross direction. Illustrated in FIG. 4 are a first pattern P1a, a second pattern P2a . . . and an nth pattern Pna (n is a natural number) disposed at the pre-correction test pattern Pa.

The first pattern P1a includes a first line pattern dimension (width) and a first space pattern dimension. Likewise, the second pattern P2a includes a second line pattern dimension and a second space pattern dimension, and the nth pattern Pna includes an nth line pattern dimension and an nth space pattern dimension.

The line pattern dimensions of the first pattern P1a to the nth pattern Pna may be of any length, 16 nm to 250 nm for example. Also, the space pattern dimensions of the first pattern P1a to the nth pattern Pna may be of any length, 16 nm to 250 nm for example. The mask patterns, in which each of the line pattern dimensions is combined with each of the space pattern dimensions, are disposed at the pre-correction test pattern Pa. In other words, n types of L/S patterns are connected at random to the pre-correction test pattern Pa.

Figures 5, 6:
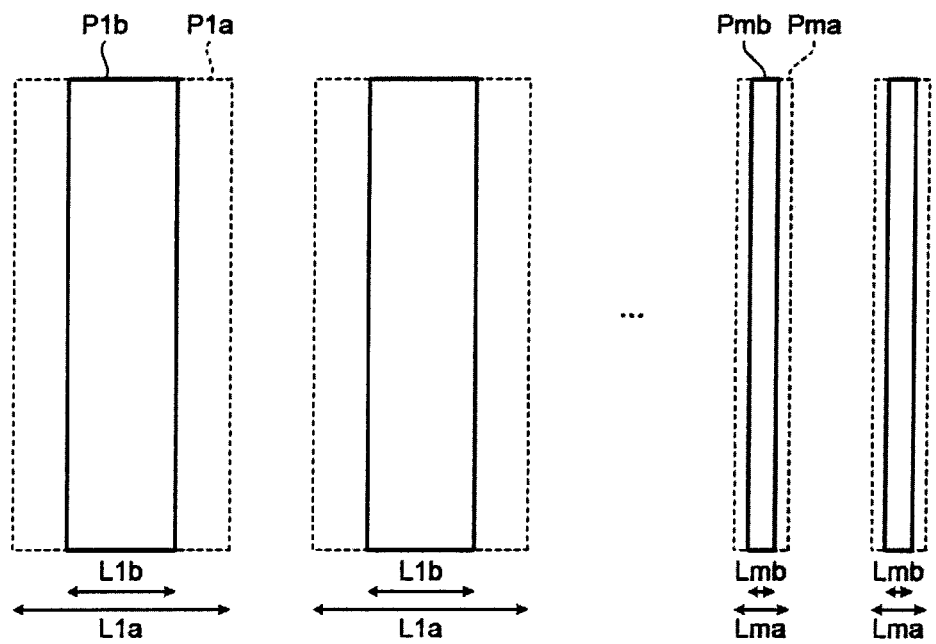
FIG. 5 is a diagram illustrating one example of average optical intensity, which is calculated for each L/S pattern.
FIG. 6 is a diagram illustrating a pattern correction amount of each L/S pattern.

FIG. 5 is a view of one example of average optical intensity, which is calculated for each L/S pattern. FIG. 5 shows the average optical intensity 21 (average optical intensity table) which is calculated by combining the line pattern dimensions and the space pattern dimensions. The line pattern herein is the line pattern on the mask, and becomes the space pattern in the event of transcription on the wafer. Likewise, the space pattern herein is the space pattern on the mask, and becomes the line pattern in the event of transcription on the wafer.

The combination between the line pattern dimensions and the space pattern dimensions is, for example, a combination between all of the line patterns and all of the space patterns present on the layout. The line pattern dimensions of the pre-correction test pattern Pa herein may be any of 16 nm, 20 nm, 22 nm, 24 nm, 32 nm, 45 nm, 90 nm, 150 nm, and 250 nm.

Also, the space pattern dimensions of the pre-correction test pattern Pa may be any of 16 nm, 20 nm, 22 nm, 24 nm, 32 nm, 45 nm, 90 nm, 150 nm, and 250 nm. The pre-correction test pattern Pa consists of the combination (81 types) between the aforementioned nine types of line pattern dimensions and the aforementioned nine types of space pattern dimensions. The average optical intensity 21 is calculated for each of the 81 types of L/S patterns.

For example, if the line pattern dimension is 16 nm and the space pattern dimension is 16 nm, the average pattern density is 0.5 and the average optical intensity 21 is 0.16. If the line pattern dimension is 250 nm and the space pattern dimension is 250 nm, the average pattern density is 0.5 and the average optical intensity 21 is 0.36. As described above, the values of the average optical intensity 21 may be different despite the average pattern densities are the same.

The average optical intensity calculation unit 11 transmits the calculated average optical intensity 21 to the average optical intensity storage unit D1. The average optical intensity storage unit D1 stores the average optical intensity 21. The pattern correction amount calculation unit 12 calculates the pattern correction amount 22 for each L/S pattern based on the average optical intensity 21 in the average optical intensity storage unit D1 (step S20).

FIG. 6 is a view illustrating a pattern correction amount of each L/S pattern. Described here are the pattern correction amounts 22 of the first pattern P1a and an mth (m is a natural number equal to or less than n) pattern Pma.

If the pattern dimension of the first pattern P1a is width L1a, the width L1a is corrected to width L1b corresponding to the average optical intensity 21 of the first pattern P1a. In other words, (L1a-L1b) is the pattern correction amount 22 of the first pattern P1a.

Also, if the pattern dimension of the mth pattern Pma is width Lma, the width Lma is corrected to width Lmb corresponding to the average optical intensity 21 of the mth pattern Pma. In other words, (Lma-Lmb) is the pattern correction amount 22 of the mth pattern Pma.

In detail, if the pattern dimensions of the second to nth patterns P2a to Pna are the widths L2a to Lna, respectively, the widths L2a to Lna are corrected to the widths L2b to Lnb corresponding to the average optical intensity 21 of the second to nth patterns P2a to Pna. In other words, (L2a-L2b)~(Lna-Lnb) are the pattern correction amount 22 of the second to nth patterns P2a to Pna.

As described above, the values of the average optical intensity 21 may be different despite the average pattern densities are the same. Therefore, in the current embodiment, the flare map (density map) is calculated after the first to nth patterns P1a to Pna are resized so that the average pattern density becomes a value corresponding to the average optical intensity 21.

For example, if the average optical intensity 21 is dxy when the line pattern dimension is x and the space pattern dimension is y, the single-side resize amount of the pattern Pna is found by $-(x-d_{xy} \times (x+y))/2$. The function to find the single-side resize amount (formula to calculate movement of a pattern edge) is a function determined by the dimensions (x) of the first to nth pattern P1a to Pna themselves and distance (y) to adjoining patterns.

Although the single-side resize amount is calculated herein using the line pattern dimension of x and the space pattern dimension of y, the single-side resize amount may be calculated using the average pattern density. For example, the average pattern density may be different for the number of the line patterns and the number of the space patterns. Moreover, patterns other than the line pattern, such as hole patterns, may be included. Therefore, the single-side resize amount may be calculated accurately using the average pattern density in calculation.

If the test-purpose mask where the pre-correction test pattern Pa is disposed is a reflective mask, the pattern edge may be moved by the function to find the single-side resize amount so that the pattern average density becomes equal to reflectance of the reflective mask.

Also, if the test-purpose mask where the pre-correction test pattern Pa is disposed is a transmissive mask, the pattern edge may be moved by the function to find the single-side resize amount so that the pattern average density becomes equal to transmittance of the transmissive mask.

Figures 7, 8:
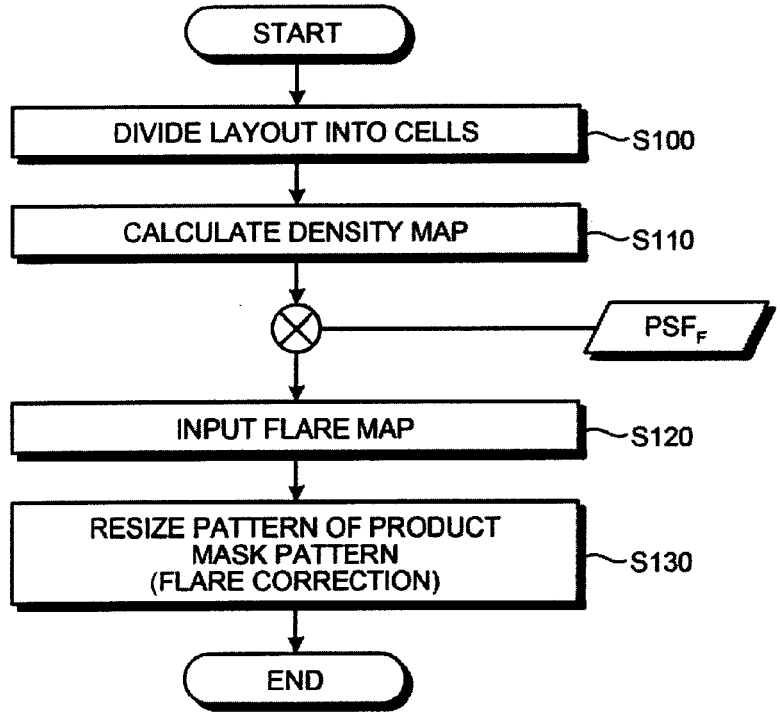
FIG. 7 is a diagram illustrating one example of the pattern correction amount, which is calculated for each L/S pattern.
FIG. 8 is a diagram chart illustrating a processing order of flare correction.

FIG. 7 is a view of one example of the pattern correction amount, which is calculated for each L/S pattern. Shown in FIG. 7 are the pattern correction amounts 22 (correction table) calculated by combining the L/S patterns and the average optical intensity 21 of FIG. 5. Specifically, the pattern correction amounts 22 are calculated for each average pattern density of the 81 types of L/S patterns.

For example, if the line pattern dimension is 16 nm and the space pattern dimension is 16 nm, the average pattern density is 0.5 and the pattern correction amount 22 is −5.38. Therefore, for the line pattern with the line and space pattern dimensions of 16 nm, the single-side resize amount is −5.38 nm and the total resize amount is 10.76 nm with both edges aligned.

Also, if the line pattern dimension is 250 nm and the space pattern dimension is 250 nm, the average pattern density is 0.5 and the pattern correction amount 22 is −33.8. Therefore, for the line pattern with the line and space pattern dimensions of 250 nm, the single-side resize amount is −33.8 and the total resize amount is 67.6 nm with both edges aligned.

The pattern correction amount calculation unit 12 transmits the calculated pattern correction amount 22 to the pattern correction amount storage unit D2. The pattern correction amount storage unit D2 stores the pattern correction amount 22. The post-correction test pattern calculation unit 13 calculates the post-correction test pattern Pb based on the pre-correction test pattern Pa in the pre-correction test pattern storage unit D3 and the pattern correction amount 22 in the pattern correction amount storage unit D2. Specifically, the post-correction test pattern calculation unit 13 prepares the post-correction test pattern Pb by correcting the pre-correction test pattern Pa using the pattern correction amount 22 (step S30). The pre-correction test pattern Pa, through pattern correction, becomes the post-correction test pattern Pb with different average, pattern density.

The post-correction test pattern calculation unit 13 transmits the calculated post-correction test pattern Pb to the post-correction test pattern storage unit D4. The post-correction test pattern storage unit D4 stores the post-correction test pattern Pb.

The flare value calculation apparatus 14 calculates the flare map 24 using the post-correction test pattern Pb in the post-correction test pattern storage unit D4 (step S40). The flare value calculation apparatus 14 transmits the calculated flare map 24 to the output unit 15. The output unit 15 transmits the flare map 24 to the flare correction apparatus 3.

The flare correction apparatus 3 performs patter correction (resizing) on the product mask pattern using the flare map 24 calculated by the flare value calculation apparatus 1, thereby performing flare correction (step S50).

Next, a processing order of flare correction is described. FIG. 8 is a flow chart illustrating a processing order of flare correction. The flare correction apparatus 3 divides product mask layout into cells (step S100). Also, the flare correction apparatus 3 prepares a density map based on the product mask layout. Specifically, the flare correction apparatus 3 calculates average pattern density for each of the cells (average pattern density of each cell) based on the product mask layout. Based on the calculated average pattern density, the density map is prepared (step S110).

$PSF_F$ is entered into the flare correction apparatus 3. Also, into the flare correction apparatus 3, the flare map 24 prepared by the flare value calculation apparatus 1 is entered (step S120). The flare map 24 and the $PSF_F$ may be entered into the flare correction apparatus 3 at any point of time before flare correction is performed.

The flare correction apparatus 3 resizes product mask pattern size for each cell using the flare map 24 and the $PSF_F$. Thereby performed is flare correction for the product mask pattern (step S130).

Flare-included total optical intensity I (x, y) for point (x, y) on the product mask is represented as formulae (1) and (2):

[Formula 1]

$$I(x,y)=I_0(x,y)(1-C)+I_{flare}(x,y) \quad (1)$$

[Formula 2]

$$I_{flare}(x,y)=I_0(x,y) \otimes PSF_F \quad (2)$$

Here, $I_0$ (x, y) is ideal optical intensity in the case of no flare, $I_{flare}$ (x, y) is flare intensity, and the $PSF_F$ is a point-spread function of flare. In the current embodiment, a density map (density value array) D is prepared as an approximation to $I_0$ (x, y) by calculating the average pattern density of each divided cell. Then, by calculating convolution sum of the $PSF_F$ and the density map D, the flare map (flare value array F) as an approximation to $I_{flare}$ (x, y) is found.

In the current embodiment, before dividing of each cell, the pre-correction test pattern Pa is corrected to the pattern size corresponding to the average optical intensity 21. In other words, before mask layout dividing, pattern resizing is performed in consideration of the average optical intensity of the space image.

Then, inside of a mask surface is divided into a plurality of cells. Next, a flare value for preparing a certain cell on an aimed cell is estimated by a function indicating influence of the flare and average pattern density calculated for each cell. Then, based on the integrated amount of flare given to the aimed cell by all or some of the cells, the pattern dimensions in the aimed cell are corrected. By this method, the calculation may take substantially less time through cell size adjustment. The pattern unit in the description herein corresponds to a multi-layered membrane mirror unit for an actual mask.

If a relation between the flare value and CD variation is known beforehand by an experiment or simulation, the CD variation of the transcription pattern may be controlled through pattern resizing corresponding to the flare map.

Figure 9:
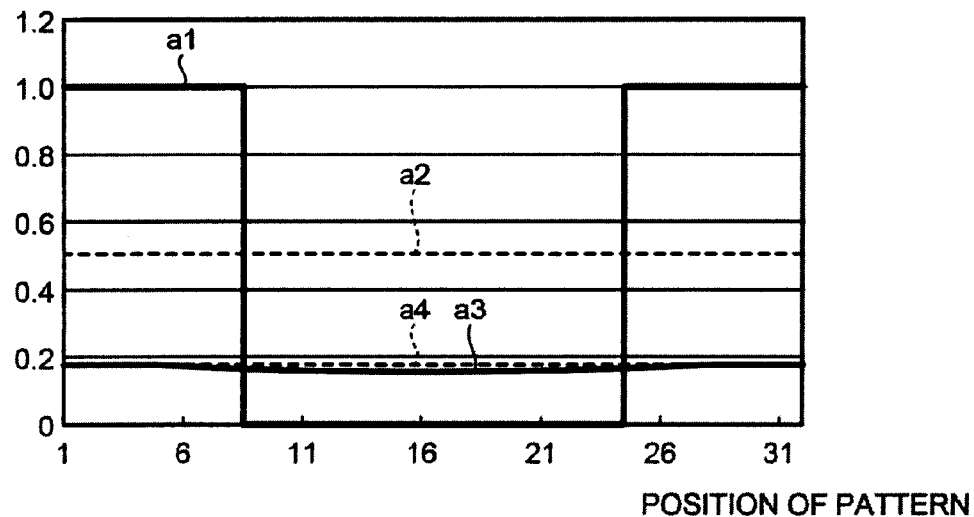
FIG. 9 is a diagram illustrating a relation between average pattern density and average optical intensity of a pre-correction test pattern including first pattern dimensions.
Figure 10:
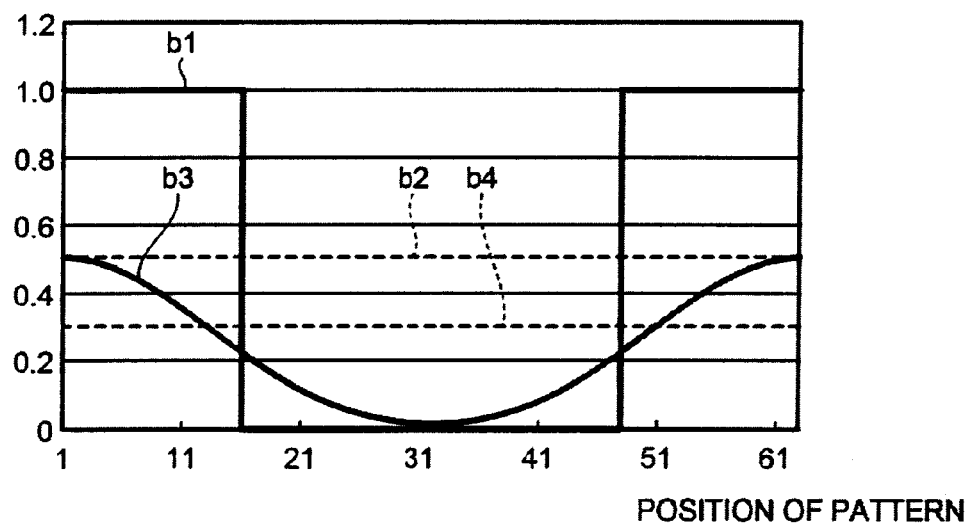
FIG. 10 is a diagram illustrating a relation between average pattern density and average optical intensity of a pre-correction test pattern including second pattern dimensions.

Described next is difference between the flare value calculated using the pre-correction test pattern Pa and the flare value prepared using the post-correction test pattern Pb. FIG. 9 is a view illustrating a relation between average pattern density and average optical intensity of a pre-correction test pattern including first pattern dimensions. FIG. 10 is a view illustrating a relation between average pattern density and average optical intensity of a pre-correction test pattern including second pattern dimensions.

Here, the line pattern dimension and the space pattern dimension of the first pattern dimensions are 16 nm alike. The line pattern dimension and the space pattern dimension of the second pattern dimensions are 32 nm alike.

Hereinafter, the L/S pattern including the first pattern dimensions is set as pattern A and the L/S pattern including the second pattern dimensions is set as pattern B. In FIG. 9, a single-cyclical section of the pattern A is shown as a continuous line a1 and the average pattern density of the pattern A is shown as a density a2. Since the layout is a flat surface, the height of 1 is given to a layout pattern part (colored part). Since the height is 1, the average pattern density of the pattern A is 0.5. Also, in FIG. 9, a section of the space image for a wafer surface is shown as a continuous line a3 and the average optical intensity of the space image is shown as an optical intensity a4.

A continuous line b1, density b2, a continuous line b3, and optical intensity b4 of FIG. 10 correspond to the continuous line a1, the density a2, the continuous line a3, and the optical intensity a4 of FIG. 9, respectively. Specifically, in FIG. 10, a single-cyclical section of the pattern B is shown as the continuous line b1 and the average pattern density of the pattern B is shown as the density b2. Since the layout is a flat surface, the height of 1 is given to a layout pattern part (colored part). Since the height is 1, the average pattern density of the pattern B is 0.5. Also, in FIG. 10, a section of the space image for a wafer surface is shown as the continuous line b3 and the average optical intensity of the space image is shown as the optical intensity b4.

Although the average pattern density in the layout-divided cell is 0.5 for both of the pattern A and the pattern B, the average optical intensities of the space images for the wafer surfaces are different for the discrepancy between diffraction efficiencies of the pattern A and the pattern B. In result, the flare intensities of the pattern A and the pattern B are different from each other. As described above, even when the average pattern density is the same, the flare values differ if the pattern dimensions and the space dimensions are different. Therefore, if the flare value is calculated using the pre-correction test pattern Pa, the same flare value is calculated for the pattern A and the pattern B.

Since the flare value changes correspondingly to the average optical intensity, the pattern correction amount 22 of each of the L/S patterns is calculated in the current embodiment by the average optical intensity 21. Specifically, the pre-correction test pattern Pa is corrected based on the average optical intensity 21 and the flare value is calculated using the post-correction test pattern Pb. In the aforementioned manner, the flare value may be calculated accurately.

Figure 11:
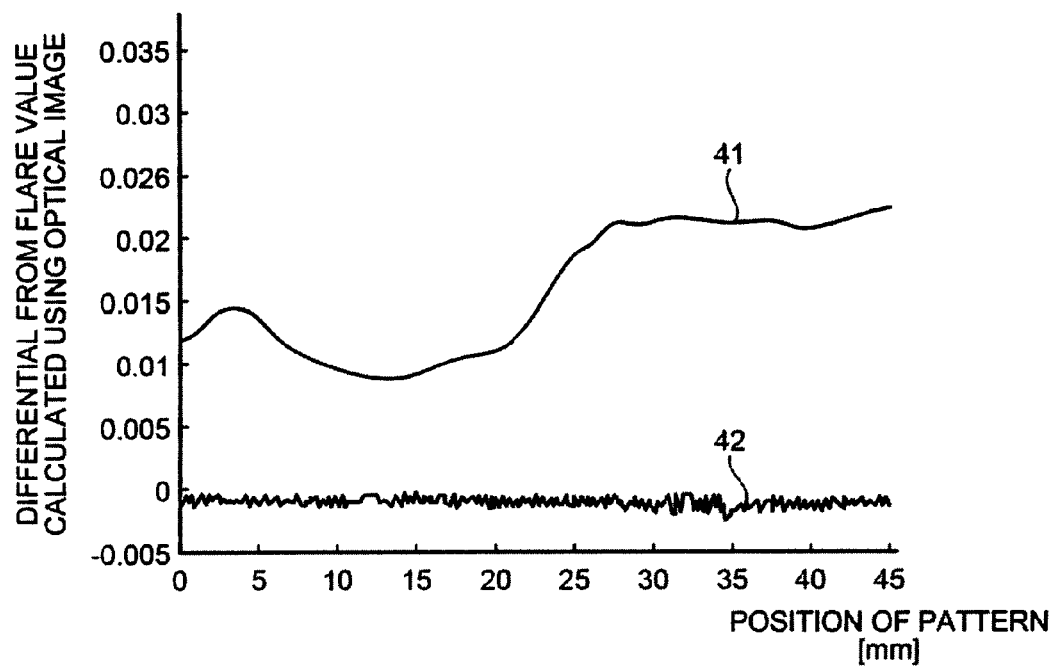
FIG. 11 is a diagram illustrating a flare value calculated using a post-correction test pattern.

FIG. 11 is a view illustrating a flare value calculated using a post-correction test pattern. In FIG. 11, a differential between the flare value calculated using the post-correction test pattern Pb and the flare value (theoretical flare value) calculated using an optical image is set as a flare value differential 42. Also, a differential between the flare value calculated using the pre-correction test pattern Pa and the flare value calculated using the optical image is set as a flare value differential 41. The flare value calculated using the optical image is a flare value found faithfully by performing a convolution on the layout with the formulae (1) and (2).

If the post-correction test pattern Pb is used for calculating the flare value, the difference from the theoretical flare value is small as seen in the flare value differential 42. In other words, by calculating the flare value using the post-correction test pattern Pb, a flare value substantially similar to the flare value calculated using the optical image may be calculated. Therefore, a flare value calculated by the flare value calculation method of the current embodiment is found to be an accurate value.

Flare correction to the product mask is performed, for example, wafer process layer by wafer process layer. At each layer, the flare-corrected product mask is used to manufacture a semiconductor device (semiconductor integrated circuit). Specifically, a flare-corrected mask pack is used to produce a product mask, exposure is performed to a resist-applied wafer using the product mask, and then the wafer is developed and a resist pattern is formed on the wafer. Then, a lower part of the wafer is etched with the resist pattern acting as a mask. In this manner, an actual pattern corresponding to the resist pattern is formed on the wafer. In manufacturing semiconductor devices, the aforementioned flare correction, exposure process, development process, etching process and so forth are repeated layer by layer. The flare value is calculated for each of the exposure apparatuses used in the exposure process. Therefore, flare correction to the product mask is also performed for each of the exposure apparatus used in the exposure process.

Figure 12:
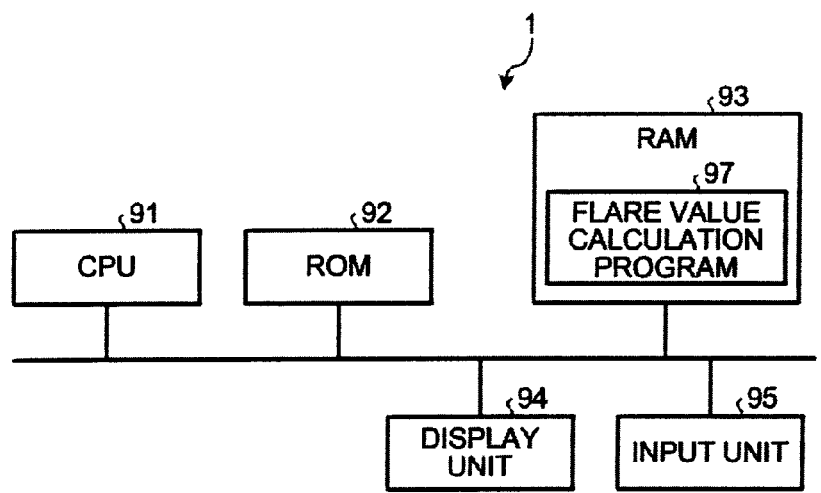
FIG. 12 is a diagram illustrating hardware configuration of the flare value calculation apparatus.

Next, hardware configuration of the flare value calculation apparatus 1 is described. FIG. 12 is a view of hardware configuration of the flare value calculation apparatus. The flare value calculation apparatus 1 includes a central processing unit (CPU) 91, a random a read-only memory (ROM) 92, a random access memory (RAM) 93, a display unit 94, and an input unit 95. The CPU 91, the ROM 92, the RAM 93, the display unit 94, and the input unit 95 are connected in the flare value calculation apparatus 1 via a bus line.

The CPU 91 performs pattern judgment using the flare value calculation program 97 which is a computer program. The display unit 94, which is a display device such as a liquid crystal monitor, displays the pre-correction test pattern Pa, the average optical intensity 21, the pattern correction amount 22, the post-correction test pattern Pb, the average pattern density 23, the flare value (flare map 24), and so forth based on commands from the CPU 91. The input unit 95, including a mouse and a keyboard, enters commands (a parameter necessary to calculate the flare value, etc.) input from outside by a user. The commands entered through the input unit 95 are transmitted to the CPU 91.

The flare value calculation program 97 is stored in the ROM 92 and loaded on the RAM 93 via the bus line. FIG. 12 shows the flare value, calculation program 97 loaded on the RAM 93.

The CPU 91 runs the flare value calculation program 97 loaded on the RAM 93. Specifically, in the flare value calculation apparatus 1, the CPU 91 reads the flare value calculation program 97 from inside the ROM 92 following the user commands through the input unit 95, develops the flare value calculation program 97 to a program storage area in the RAM 93, and performs various processing. The CPU 91 has various data generated during the processing temporarily stored in a data storage area disposed in the RAM 93.

The flare value calculation program 97 run in the flare value calculation apparatus 1 is of modular configuration, including the average optical intensity calculation unit 11, the pattern correction amount calculation unit 12, the post-correction test pattern calculation unit 13, and the flare value calculation, unit 14, all of which are loaded on a main storage unit and formed on the main storage unit.

Although the correction table (pattern correction amount 22) allotting different pattern correction values is prepared in the current embodiment for the combinations of all of the line and space patterns existing on the layout, another correction table may be prepared. For example, a combination of a line pattern and a space pattern having similar values of the average optical intensity 21 may be set as a single group and a group-specific correction table may be prepared.

For an L/S pattern not calculated as the pattern correction amount 22, a value in the pattern correction amount 22 may be used to calculate the pattern correction amount. For example, if the line pattern dimension is 18 nm, the pattern correction amount is calculated using the pattern correction amounts in the case of the line pattern dimension being 16 nm and/or 20 nm.

Although the flare map 24 is prepared in the current embodiment using a test pattern, the flare map 24 may be prepared using a mask pattern instead of the test pattern. Although mask pattern correction (flare correction) to a product mask is described in the current embodiment, the mask pattern correction may be performed to a mask other than the product mask.

According to the current embodiment, the flare value may be calculated with accuracy and in a short period of time because the post-correction test pattern Pb resizing the pre-correction test pattern Pa in consideration of the space image is used in the calculation of the flare value. Therefore, the flare may be estimated with efficiency and accuracy and, as a result, a pattern which accurately corrects dimension variation of the transcription pattern arising from the flare may be prepared.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flare value calculation method comprising:
    calculating an average optical intensity for each of mask patterns when an exposure process is performed on a substrate using a mask pattern group including the mask patterns of a plurality of dimensions;
    calculating a pattern correction amount for each of the mask patterns corresponding to the average optical intensity and information about the dimensions of the mask patterns;
    preparing post-correction mask patterns by performing pattern correction on each of the mask patterns using the pattern correction amount calculated for each of the mask patterns; and
    calculating a flare value of a projection optical system of an exposure apparatus using a pattern average density of the post-correction mask patterns.

2. The method of claim 1,
    wherein the preparing of the post-correction mask pattern is performed by moving a pattern edge of the mask pattern according to a function defined by dimensions of the mask pattern including the pattern edge and a distance between the pattern edge and a neighboring pattern adjacent to the pattern edge.

3. The method of claim 2,
    wherein if a mask where the mask pattern is disposed is a reflective mask, the pattern edge of the mask pattern is moved according to the function so that the pattern average density becomes equal to reflectance of the reflective mask, and
    if a mask where the mask pattern is disposed is a transmissive mask, the pattern edge of the mask pattern is moved according to the function so that the pattern average density becomes equal to transmittance of the transmissive mask.

4. The method of claim 1,
    wherein the information about the dimensions of the mask patterns is an average density of the mask patterns.

5. The method of claim 1,
    wherein the pattern correction amount is calculated using information about dimensions of another mask pattern, an average optical intensity calculated from the another mask pattern, and a pattern correction amount calculated from the another mask pattern.

6. The method of claim 1,
wherein the plurality of dimensions are dimensions determined by combining line pattern dimensions and space pattern dimensions.

7. A flare correction method comprising:
calculating an average optical intensity for each of mask patterns when an exposure process is performed on a substrate using a mask pattern group including the mask patterns of a plurality of dimensions;
calculating a pattern correction amount for each of the mask patterns corresponding to the average optical intensity and information about the dimensions of the mask patterns;
preparing post-correction mask patterns by performing pattern correction on each of the mask patterns using the pattern correction amount calculated for each of the mask patterns;
calculating a flare value of a projection optical system of an exposure apparatus using a pattern average density of the post-correction mask pattern; and
performing flare correction on correction-target mask patterns by changing dimensions of the correction-target mask patterns according to the flare value.

8. The method of claim 7,
wherein the performing of the flare correction comprises:
dividing the correction-target mask patterns into a plurality of cell areas in a mask surface;
calculating a flare value to be received by a cell serving as a flare value calculation target cell from another cell, the calculating being performed for each cell using a pattern average density calculated for each cell and a function defining flare influence;
performing flare correction on mask patterns disposed on the mask surface in a way of performing flare correction on a mask pattern disposed in the flare value calculation target cell, based on an integrated amount of a flare value given to the flare value calculation target cell by the another cell.

9. The method of claim 7,
wherein the preparing of the post-correction mask pattern is performed by moving a pattern edge of the mask pattern according to a function defined by dimensions of the mask pattern including the pattern edge and a distance between the pattern edge and a neighboring pattern adjacent to the pattern edge.

10. The method of claim 9,
wherein if a mask where the mask pattern is disposed is a reflective mask, the pattern edge of the mask pattern is moved according to the function so that the pattern average density becomes equal to reflectance of the reflective mask, and
if a mask where the mask pattern is disposed is a transmissive mask, the pattern edge of the mask pattern is moved according to the function so that the pattern average density becomes equal to transmittance of the transmissive mask.

11. The method of claim 7,
wherein the information about the dimensions of the mask patterns is an average density of the mask patterns.

12. The method of claim 7,
wherein the pattern correction amount is calculated using information about dimensions of another mask pattern, an average optical intensity calculated from the another mask pattern, and a pattern correction amount calculated from the another mask pattern.

13. The method of claim 7,
wherein the plurality of dimensions are dimensions determined by combining line pattern dimensions and space pattern dimensions.

14. A computer program product comprising a non-transitory computer-readable recording medium storing a plurality of commands which are executable on a computer and configured to calculate a flare value of an optical system of an exposure apparatus, the plurality of commands causing the computer to execute:
calculating an average optical intensity for each of mask patterns when an exposure process is performed on a substrate using a mask pattern group including the mask patterns of a plurality of dimensions;
calculating a pattern correction amount for each of the mask patterns corresponding to the average optical intensity and information about the dimensions of the mask patterns;
preparing post-correction mask patterns by performing pattern correction on each of the mask patterns using the pattern correction amount calculated for each of the mask patterns; and
calculating a flare value of a projection optical system of an exposure apparatus using a pattern average density of the post-correction mask patterns.

15. The computer program product according to claim 14,
wherein the preparing of the post-correction mask pattern is performed by moving a pattern edge of the mask pattern according to a function defined by dimensions of the mask pattern including the pattern edge and a distance between the pattern edge and a neighboring pattern adjacent to the pattern edge.

16. The computer program product according to claim 15,
wherein if a mask where the mask pattern is disposed is a reflective mask, the pattern edge of the mask pattern is moved according to the function so that the pattern average density becomes equal to reflectance of the reflective mask, and
if a mask where the mask pattern is disposed is a transmissive mask, the pattern edge of the mask pattern is moved according to the function so that the pattern average density becomes equal to transmittance of the transmissive mask.

17. The computer program product according to claim 14,
wherein the information about the dimensions of the mask patterns is an average density of the mask patterns.

18. The computer program product according to claim 14,
wherein the pattern correction amount is calculated using information about dimensions of another mask pattern, an average optical intensity calculated from the another mask pattern, and a pattern correction amount calculated from the another mask pattern.

19. The computer program product according to claim 14,
wherein the plurality of dimensions are dimensions determined by combining line pattern dimensions and space pattern dimensions.

* * * * *